(12) United States Patent
Meza et al.

(10) Patent No.: US 9,176,544 B2
(45) Date of Patent: Nov. 3, 2015

(54) COMPUTER RACKS

(75) Inventors: Justin James Meza, Los Angeles, CA (US); Jichuan Chang, Sunnyvale, CA (US); Parthasarathy Ranganathan, San Jose, CA (US); Amip J. Shah, Santa Clara, CA (US); Cullen E. Bash, Los Gatos, CA (US); Chih C. Shih, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 38 days.

(21) Appl. No.: 13/704,147

(22) PCT Filed: Jun. 16, 2010

(86) PCT No.: PCT/US2010/038874
§ 371 (c)(1),
(2), (4) Date: Dec. 13, 2012

(87) PCT Pub. No.: WO2011/159296
PCT Pub. Date: Dec. 22, 2011

(65) Prior Publication Data
US 2013/0094138 A1    Apr. 18, 2013

(51) Int. Cl.
*H05K 5/00* (2006.01)
*G06F 1/18* (2006.01)
*G06F 1/20* (2006.01)
*H05K 7/14* (2006.01)

(52) U.S. Cl.
CPC ............... *G06F 1/181* (2013.01); *G06F 1/184* (2013.01); *G06F 1/20* (2013.01); *H05K 7/1489* (2013.01); *G06F 2200/201* (2013.01)

(58) Field of Classification Search
USPC ............................................ 361/752, 679.33
See application file for complete search history.

(56) References Cited

U.S. PATENT DOCUMENTS

| 3,704,394 | A  | 11/1972 | Johnson et al.  |
| 6,155,433 | A  | 12/2000 | Anderson et al. |
| 6,220,456 | B1 | 4/2001  | Jensen et al.   |
| 6,452,805 | B1 | 9/2002  | Franz et al.    |
| 7,171,589 | B1 | 1/2007  | Urmanov et al.  |
| 7,221,572 | B2 | 5/2007  | Arippol         |

(Continued)

FOREIGN PATENT DOCUMENTS

| JP | 2001-244661 | 9/2001  |
| JP | 2006-309856 | 11/2006 |
| JP | 2009-104650 | 5/2009  |

OTHER PUBLICATIONS

International Search Report, PCT/US2010/033874, Mar. 25, 2011, 9 pages.

(Continued)

*Primary Examiner* — Andargie M Aychillhum
(74) *Attorney, Agent, or Firm* — Hanley Flight & Zimmerman, LLC (57) ABSTRACT

Example computer racks to improve environmental sustainability in data centers are disclosed. An example computer rack includes a spine (125); a first set of support structures (500) and a second set of support structures (500) extending from the spine (125). Each of the support structures (500) is positioned to receive a respective blade. A first communication port is carried by the spine (125) and associated with the first set of support structures (500). A second communication port is carried by the spine (125) and associated with the second set of support structures (500).

15 Claims, 10 Drawing Sheets

(56) References Cited

U.S. PATENT DOCUMENTS

| | | | |
|---|---|---|---|
| 7,313,503 | B2 | 12/2007 | Nakagawa et al. |
| 7,487,012 | B2 | 2/2009 | Bose et al. |
| 7,529,097 | B2 | 5/2009 | Coglitore et al. |
| 7,564,685 | B2 | 7/2009 | Clidaras et al. |
| 7,639,486 | B2 | 12/2009 | Champion et al. |
| 7,643,291 | B2 | 1/2010 | Mallia et al. |
| 7,646,109 | B2 | 1/2010 | Belady et al. |
| 7,646,590 | B1 | 1/2010 | Corhodzic et al. |
| 7,791,890 | B2 | 9/2010 | Ishida |
| 2003/0048613 | A1* | 3/2003 | Garnett et al. ............ 361/724 |
| 2004/0054939 | A1 | 3/2004 | Guha et al. |
| 2005/0265004 | A1* | 12/2005 | Coglitore et al. .......... 361/724 |
| 2006/0259796 | A1 | 11/2006 | Fung |
| 2007/0081308 | A1 | 4/2007 | Ishida |
| 2008/0212276 | A1* | 9/2008 | Bottom et al. ............ 361/686 |
| 2009/0129014 | A1 | 5/2009 | Larsen et al. |

OTHER PUBLICATIONS

Lim et al~"Disaggregated Memory for Expansion and Sharing in Blade Servers"~Proc 36th Int'l Symp on Computer Architecture (ISCA)~Jun. 2009~pp. 267-278.

Lim et al~"Understanding and Desigining New Server Architectures for Emerging Warehouse-Computing Environments"~Proc 35th Int'l Symp on Computer Architecture (ISCA) Jun. 2009~ pp. 315-326.

Air-cooling technology used at Teesside data centre—Intelligent Server Cabinet/Rack Solutions (Web Page), Last Updated: Nov. 26, 2009, 1 page, http://www.comms-express.com/news/server-racks/intelligent-solutions/ air-cooling-technology-usea-at-teesside-data-centre-intelligent-server-cabinet-rack-solutions-19482050/.

Allan Leinwand, Where Are the Green Network Devices? (Research Paper), Sep. 17 2007, 5 Pages.

* cited by examiner

COMPUTER RACKS

BACKGROUND

The carbon footprint of the Information Technology (IT) industry, though only 2% of the total economy, is estimated to be equal to that of the entire aviation industry. This large carbon footprint is partly a result of high levels of electricity consumption for data centers within the IT industry. For example, the U.S. Environmental Protection Agency (EPA) reported that data centers in the U.S. alone in 2006 consumed more than 61 billion kilowatt-hours (kWh) of electricity. This level of energy consumption is equivalent to nearly 5.8 million average households.

IT systems are increasingly being used to address the remaining 98% of the carbon footprint of the total economy. For example, IT systems may provide videoconferencing functionalities that replace the need for travel.

DETAILED DESCRIPTION

Many current and prior Information Technology (IT) systems have been designed to optimize performance of data centers, without concern for environmental sustainability or other environmental factors. Further, current approaches of addressing environmental sustainability in data centers fail to address the environmental sustainability across all stages of the lifecycle of the data center such as, the extraction of raw materials used to construct the data center components, manufacturing of the data center components, transportation of the data center components, operation of the data center components, and disposal of the data center components. Rather, current approaches tend to address environmental sustainability in data centers from purely energy consumption perspective.

One approach to quantifying the environmental sustainability in a data center disclosed herein is a life-cycle assessment, which comprises many, most, or all facets of the data center's environmental impact. An example implementation of the life-cycle assessment involves measuring and/or approximating thermodynamic energy consumption to assess environmental sustainability. Exergy quantifies the amount of available energy that is consumed to create, operate, and maintain the data center and/or its components over the lifetime of the data center. For example, while energy is neither created nor destroyed (e.g., the first law of thermodynamics), exergy is continuously consumed in the performance of useful work by any real entropy-generating process (e.g., the second law of thermodynamics). Therefore, measuring exergy consumption across a substantial portion of the facets of the data center for the lifetime of the data center allows for a measure of environmental sustainability.

A further approach disclosed herein involves categorizing exergy consumption into three broad categories: embedded exergy consumption, operational exergy consumption, and infrastructure exergy consumption. By categorizing exergy consumption into these categories, it is possible to measure and/or approximate the total exergy consumption of the components inside the data center; and further, the data center as a whole.

Embedded exergy consumption of a component of a data center is a measure of the exergy that is used to build that specific component of the data center. Embedded exergy consumption includes exergy used in, for example, extraction of raw materials, manufacturing, transportation, and recycling. For most components, most of the embedded exergy is consumed during the manufacturing process, as manufacturing highly ordered electronics components (e.g., processors, memory modules, hard disk drives, etc. . . . ) is typically a complex process that consumes a lot of exergy.

Operational exergy consumption of a component of a data center is a measure of the exergy that is used to operate that specific component of the data center over the operational lifetime of the component. Operational exergy consumption typically includes the energy used to power the component. For example, a component may require a certain amount of power to be operated for a year and may have an expected lifetime of 3 years. When combined with an expected 99.99% uptime it is possible to predict the amount of exergy that will be consumed by the component. Infrastructure exergy consumption, while related to operational exergy consumption, accounts for exergy used in the support infrastructure of the IT components (e.g., exergy used to cool the data center).

Improving the environmental sustainability of a data center (e.g., lowering the total exergy consumed) can be accomplished in a number of manners. For example, embedded exergy consumption may be reduced by selecting components for the data center which are produced by more exergy efficient methods. In many cases, the most effective way to reduce embedded exergy consumption is to reduce the amount of materials used in the data center. For example, a smaller memory configuration uses less silicon and consequently reduces the embedded energy consumption associated with memory. Embedded exergy consumption can be improved by upcycling (reusing components when they would normally be recycled or discarded), as this amortizes the embedded exergy consumption over a longer period of time. To facilitate upcycling, data centers may be architected to enable localized updates to be made to components (e.g., replacing a single component of a computer in the data center rather than replacing the entire computer).

Operational and infrastructure exergy consumption may be reduced by selecting more energy efficient components (e.g., lower powered processors), and by organizing the data center to optimize cooling. For example, data centers may be architected such that components which generate more heat are prioritized for cooling efforts.

Figure 1:
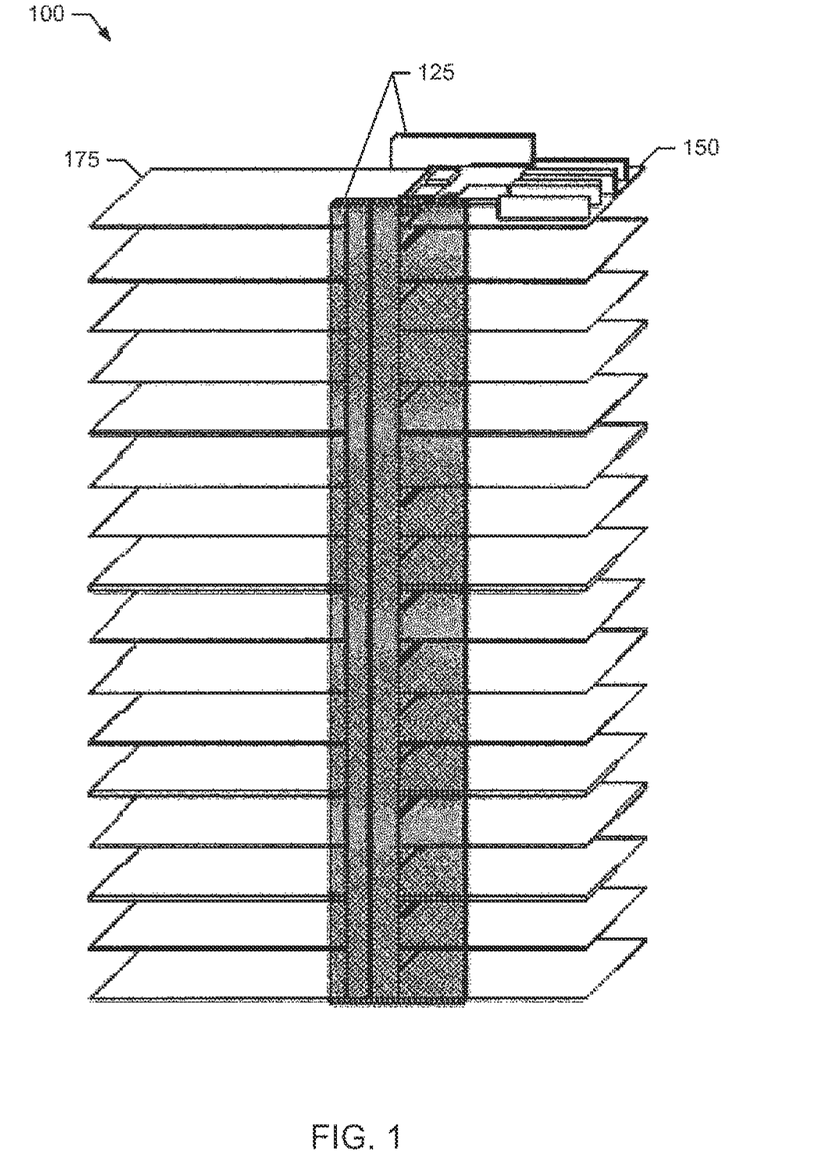
FIG. 1 is a diagram of an example computer rack constructed according to the teaching of this disclosure.

FIG. 1 is a diagram of an example computer rack 100 constructed in accordance with the teachings of this disclosure. The example computer rack 100 includes a spine 125, one or more compute blade(s) 150, and one or more non-compute blade(s) 175. In the illustrated example, the spine 125 is positioned vertically and includes receivers to secure and support the blades 150 and 175 that are received by the spine 125. However, the spine 125 may be aligned in other directions such as, for example, horizontally. The spine 125 facilitates communication between the blades 150 and 175 via electrical or optical traces which are described below in conjunction with FIGS. 7 and 8. The compute blades 150 of the illustrated example provide processing functionality, while the non-compute blades 175 provide non-computational support (e.g., memory, storage, networking, etc. . . . ).

Figure 2:
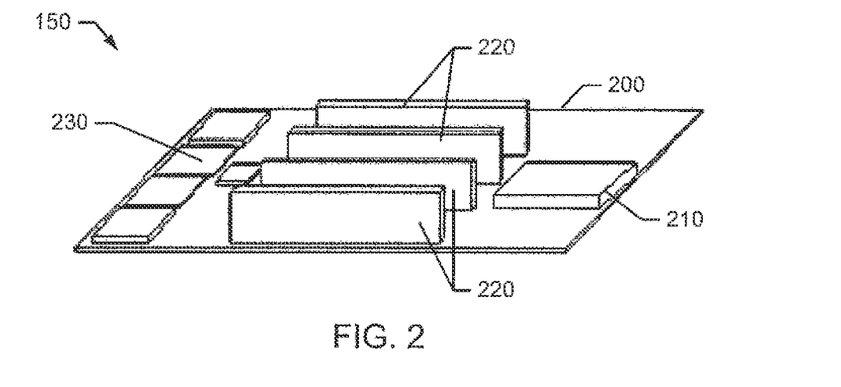
FIG. 2 is a diagram of an example computer blade received by the computer rack as shown in FIG. 1.

FIG. 2 is a diagram of an example compute blade 150 that may be used in the example of FIG. 1. The example compute blade 150 shown in FIG. 2 includes a printed circuit board (PCB) 200, a processor 210, onboard memory 220, and non-processor silicon components 230. The PCB 200 of the compute blade 150 is a circuit board dimensioned to be received by the spine 125 of the computer rack 100 shown in FIG. 1. The PCB 00 allows for onboard communication between the processor 210, the memory 220, and the non-processor silicon components 230. In the illustrated example of FIG. 2, the PCB 200 has a small form factor to both reduce the amount of raw materials needed to construct the data center (e.g., to reduce the embedded exergy consumption) and allow for efficient cooling (e.g., to reduce the expended infrastructure exergy consumption). However, other factors may be considered which may result in other dimensional configurations of the PCB 200. For example, the PCB 200 may be enlarged to account for future expandability of the compute blade (e.g., additional processors or more memory modules may be added later). Alternatively, the PCB 200 may be implemented by a readily available part. For example, a commodity motherboard (e.g., an ATX or microATX motherboard) may be used to implement the PCB 200 of the compute blade 150.

In the illustrated example, the processor 210 is connected to the PCB 200 via a socket connection. The socket connection allows the processor to be quickly replaced in the event of a failure. The processor 210 may alternatively be directly soldered to the PCB 200, or any other means of coupling the processor 210 to the PCB 200 may be used. The processor 210 is communicatively coupled with the onboard memory 220 and the non-processor silicon components 230 via traces on the PCB 200.

The onboard memory 220 of the illustrated example is a set of dual in-line memory modules (DIMM), and is communicatively coupled to the processor 210. While DIMMs are used in the example shown in FIG. 2, any other type of memory modules may additionally or alternatively be used. Further, the communicative coupling of the memory 220 to the processor 210 may be implemented via the non-processor silicon components 230. In the illustrated example, four DIMM modules are shown. However, any number of DIMM modules may be used. The onboard memory 220 provides local memory to the processor 210. Additional memory modules contained in non-compute blades 175 may provide remote memory.

The non-processor silicon components 230 of the illustrated example are chipsets used to communicatively couple the processor 210 with additional components of the compute blade 150. For example, the non-processor silicon components 230 may include a Northbridge that provides access to the onboard memory 220. Further, the non-processor silicon components 230 may include a Southbridge that provides communicative links to the non-compute blades 175. In the illustrated example, the communicative links to the non-compute blades 175 are implemented by the traces carried by the spine 125 of the computer rack 100.

Figure 3:
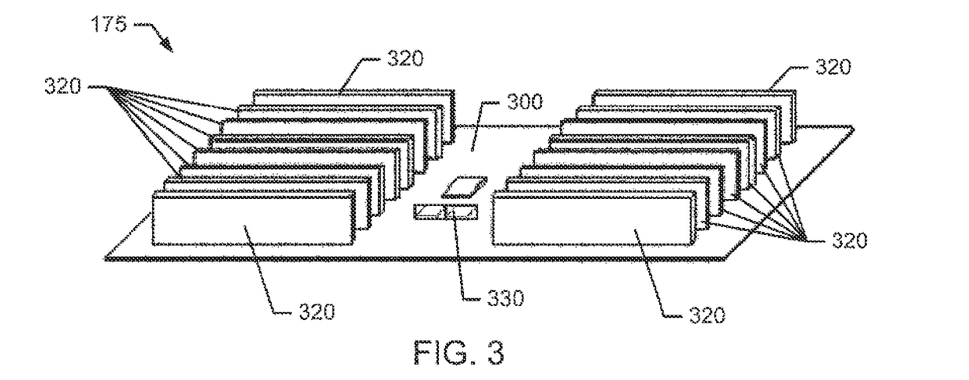
FIG. 3 is a diagram of an example non-compute blade received by the computer rack as shown in FIG. 1.

FIG. 3 is a diagram of an example non-compute blade 175 that may be used in the example of FIG. 1. The example non-compute blade 175 of FIG. 3 comprises a printed circuit board (PCB) 300, a set of memory modules 320, and non-processor silicon components 330. The PCB 300, much like the PCB 200 shown in FIG. 2, has a small form factor to both reduce the amount of raw materials needed to construct the data center (e.g., to reduce the embedded exergy consumption) and allow for efficient cooling (e.g., to reduce the expended infrastructure exergy consumption). However, other factors may be considered which may result in other dimensional configurations of the PCB 300. For example, the PCB 300 may be enlarged to account for future expandability of the non-compute blade (e.g., more memory modules may be added later). In the illustrated example, the PCB 300 receives the memory modules 320 via memory adapters which place the memory modules 320 in a perpendicular orientation to the PCB 300 in order to allow for easy access to the memory modules 320 in the event of a failure. However, other methods of mounting memory modules 320 may additionally or alternatively be used. For example, adapters which place the memory modules in parallel orientation to the PCB 300 may be used to increase airflow over the memory modules.

The memory modules 320 of the illustrated example are DIMMs. However, any other type of memory module may additionally or alternatively be used. The memory modules 320 provide remote memory to the compute blade 200 via the traces of the spine 125. While in the illustrated example, sixteen memory modules 320 are shown, any number of memory modules 320 may be used. For example, sixty four memory modules 320 may be used to increase the amount of available memory.

The non-processor silicon components 330 of the illustrated example are accessed by the compute blade 150 via the traces of the spine 125. The non-processor silicon components 330 provide functionality that may be aggregated between multiple processors. For example, the non-processor silicon components 330 may provide networking support, graphics controllers, communications adapters, etc. Further, the non-processor silicon components 330 may function as a memory and/or I/O controller for the processor 210.

Figure 4:
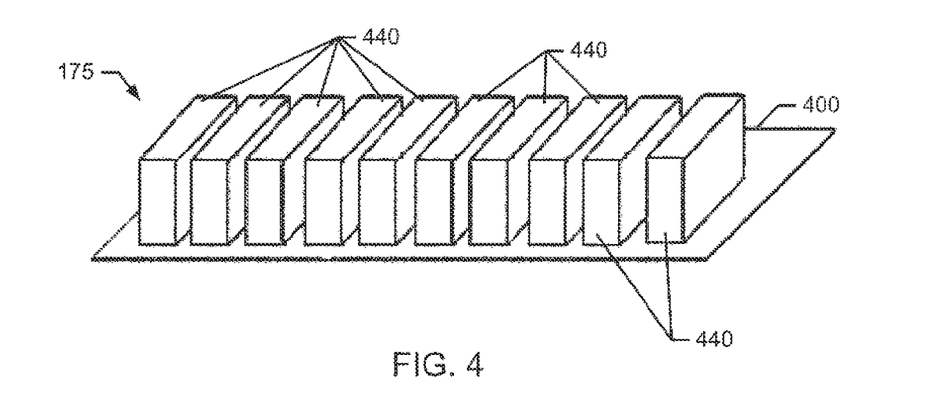
FIG. 4 is a diagram of an example non-compute blade received by the computer rack as shown in FIG. 1.

FIG. 4 is a diagram of a second example non-compute blade 175 that may be used in the example of FIG. 1. The example non-compute blade 175 shown in FIG. 4 comprises a printed circuit board (PCB) 400, and storage units 440. The PCB 400, much like PCBs 200 and 300 shown in FIGS. 2 and 3, is dimensioned to reduce the amount of materials used to support the components of the non-compute blade 175. However, the PCB 400 may alternatively be dimensioned larger to provide for more storage units 440. In the illustrated example, the storage units 440 are hard disk drives. However, any other type of storage units may additionally or alternatively be used such as, for example, solid state drives, RAM disks, tape drives, flash memory, etc. In the illustrated example, the storage units provide long-term storage for the processor 210, and are accessed via the traces of the spine 125.

Figure 5:
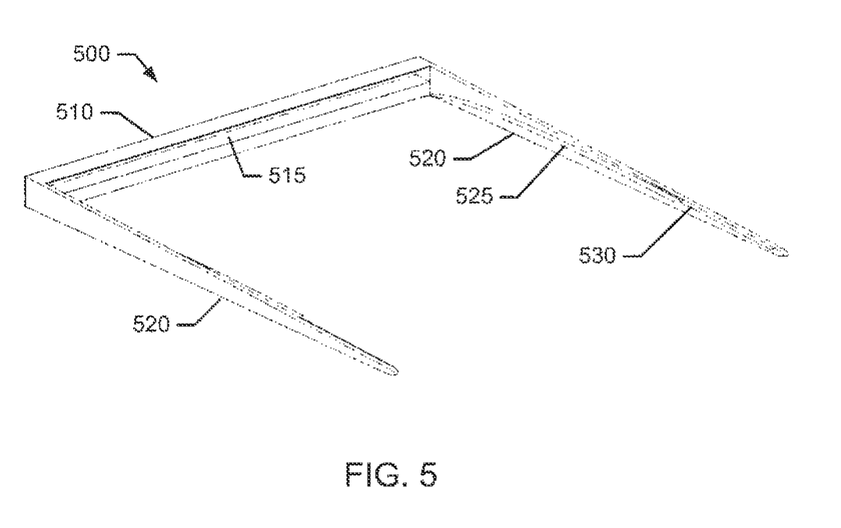
FIG. 5 is a diagram of an example support structure to support a respective one of blades of FIGS. 2-4.

FIG. 5 is a diagram of an example support structure 500 for supporting the blades 150 and 175 shown in FIG. 1. The example support structure 500 comprises a central member 510 joining two outer support arms 520. Primarily, the example support structure 500 is used to physically support the blades 150, 175. However, there may be other functionality associated with the support structure 500. For example, the support structure 500 may additionally provide an interface for a communication link. In the illustrated example, the central member 510 has an inner slot or receiver 515 to receive the end of a blade. The inner slot 515 contains an electronic connection to communicatively couple the support structure 500 to the blade (e.g., a compute blade 150 or a non-compute blade 175). In the illustrated example, the electronic connection of the inner slot 515 further couples the blade 150 or 175 to the traces of the spine 100. This method of connection allows the traces to be more easily concealed, and improves cooling efficiency, as cables are not blocking airways. Alternatively, the inner slot 515 may not provide the electronic connection, and the connection may be implemented by alternate means. For example, the connection may be implemented by an optical connection (e.g., an optical interconnect may be housed within the central member 510 such that engaging the blade with the support structure 500 completes the connection), or the connection may be implemented by a connection from the traces of the spine 100 directly to the blades 150 and 175 (e.g., via an external wire which connects to the blades).

The two support arms 520 extend outward from the central member 510 in parallel relative to each other. Each of the support arms 520 includes a support guide 525. The support guide 525 underlies and thus provides physical support for the received blade 150, 175. Each support guide 525 extends perpendicular to the inner surface of its corresponding support arm 520 and provides a rigid, underlying support for the blade 150, 175. In the illustrated example, the support guide 525 extends along the corresponding support arm 520 and terminates adjacent the central member 510. However, the support guide 525 could additionally or alternatively be located at any point along the support arm 520. Further, the support guide 525 may be split into smaller sections or tabs along the support arm 520. In addition to the support guide 525, each support arm 520 comprises a flexible clip 530. Like the support guides 525, the flexible clip 530 extends perpendicular to the inner surface of its corresponding support arm 520. The flexible clip 530 is located at the free end on top of its support arm 520 furthest from the central member 510. In the illustrated example, the flexible clip 530 allows a blade 150, 175 to be secured into place, ensuring that the blade does not become unintentionally separated from the support structure 500. For example, the blade 150, 175 may be snapped into place below the flexible clip 530, and above the support guide 525.

In the illustrated example, the support structure 500 is constructed from plastic. However, any other material may additionally or alternatively be used to construct the support structure 500. For example, the support structure 500 may be constructed from metal. Further, certain parts of the support structure 500 may be made from a first material, while other parts may be made from a second or different material. For example, the central member 510, support arms 520, and support guide 525 may be constructed from metal while the flexible clip 530 may be constructed from plastic or rubber.

While an example support structure 500 is shown in FIG. 5 other implementations may be used to support the blades 150 and 175. For example, instead of the U-shaped profile of the example support structure 500 of FIG. 5, a plate or tray (which may be solid or provided with one or more apertures) may be used to support the blades 150, 175. Additionally or alternatively, there may be connective struts joining the two outer support arms 520. Such strut(s) may be located anywhere between the arm 520 (e.g., at the tip, in the middle, etc.)

Figure 6:
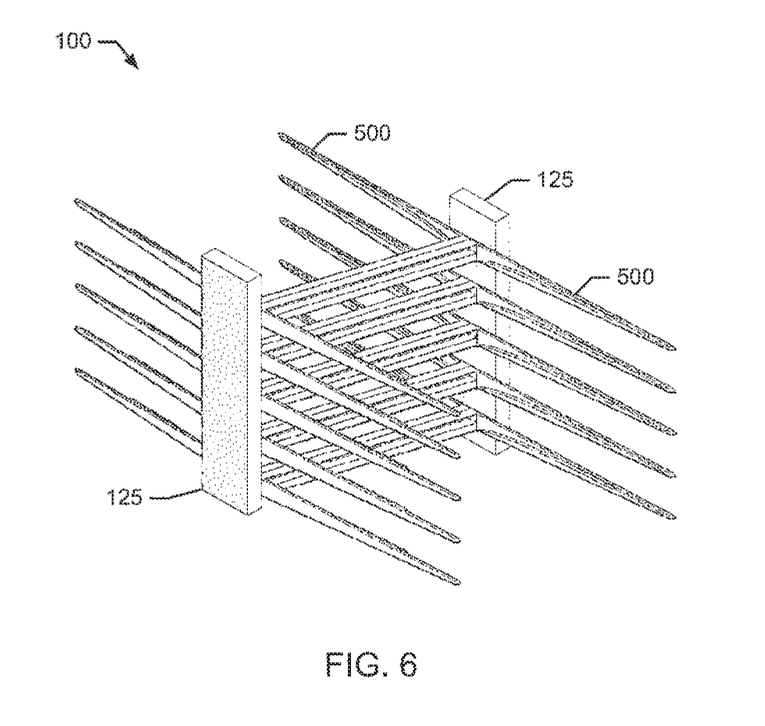
FIG. 6 is a diagram of the example computer rack of FIG. 1 detailing the H-shaped cross section of the support structures shown in FIG. 5.

FIG. 6 is a diagram of an example electronics stack 100. The example electronics stack 100 of FIG. 6 comprises the spine 125 and a plurality of support structures 500 extending outwardly in opposite directions. The spine 125 is comprised of two vertically aligned columns which are coupled to the central members 510 of the support structures 500 as shown in FIG. 5. In general, the spine supports and aligns the support structures 500 in opposite directions to form pairs of support structures. In the illustrated example, each pair of opposed support structures 500 lie in a same plane and, thus, form an H-shaped profile or cross section. While in the illustrated example, each central member 510 of each of a pair of support structures 500 is in contact, other implementations may additionally or alternatively be used. For example, the central members 510 may be aligned such that there is a horizontal and/or vertical gap in between the support structures 500 of a pair. In the illustrated example, the support structures 500 are placed in a horizontal plane. However, the support structures 500 may, additionally or alternatively, be placed in other alignments such as, for example, a vertical plane or any angle in between horizontal and vertical.

In the illustrated example, five pairs of support structures 500 are shown. However, in a computer rack 100 any number of pairs of support structures 500 may be used. For example, sixty four pairs of support structures may be used which, in turn, allows one hundred and twenty eight blades 150, 175 to be received by the computer rack 100. The pairs of support structures 500 are separated by a vertical distance which allows air to flow between each blade 150, 175 received by the computer rack 100. While in the illustrated example the vertical distance separating the pairs of support structures is the same between all pairs of support structures, the vertical distance may be increased or decreased. The vertical distance may be selected to, for example, streamline airflow between the blades. For example, a non-compute blade 175 comprising hard disk drives 440 as shown in FIG. 4 wherein the hard disk drives 440 are standing on their side respective to the PCB 400, may require more vertical distance than a compute blade 150. Additionally, the pairs of support structures are shown in substantial vertical alignment. However, the pairs of support structures do not necessarily need to be in substantial vertical alignment. For example, support structures near the bottom of the computer rack may have a horizontal gap between the support structures 500 of the pair to create a lower center of gravity for the computer rack 100.

Figure 7:
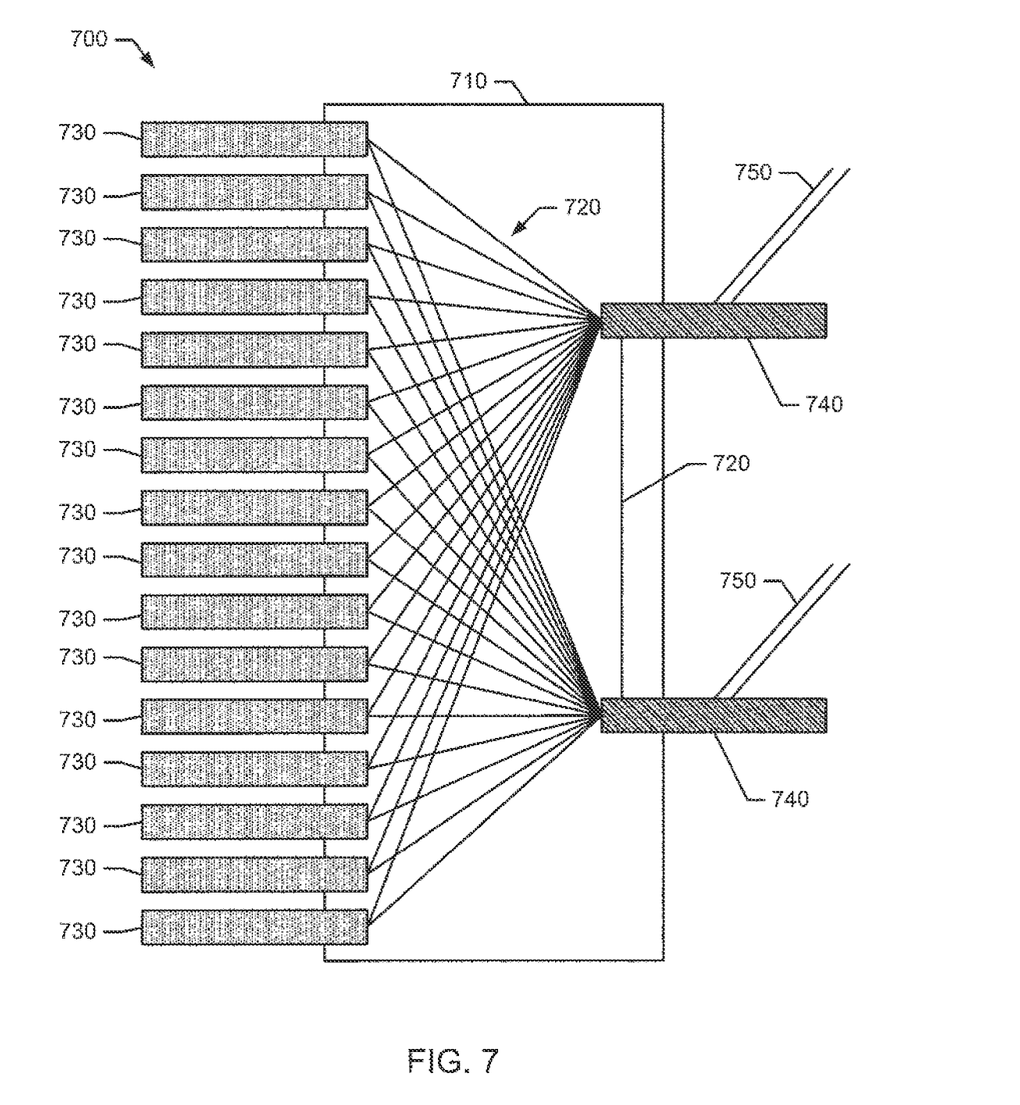
FIG. 7 is a diagram of a previous backplane implementation used in data centers.

FIG. 7 illustrates a previous backplane structure 700 used in data centers. The example backplane structure of FIG. 7 includes a backplane medium 710, traces 720, computer units 730, networking units 740, and external communication links 750. The illustrated example shows a star topology. The backplane medium 710 in the illustrated example is a printed circuit board and carries the traces 720. The traces are electronic and embedded in the backplane medium 730. For example, the backplane medium 710 may include a set of cable retaining clips and the traces 720 may be cables connecting the units 730 and 740 to each other.

Each of the computer units 730 in the backplane structure of FIG. 7 is a fully functioning computer unit. The resources included in the computer unit 720 extend only as far as the computer unit 720 (e.g., resources such as memory need not be shared).

The networking units 740 provide network connectivity to the computer units. The networking units 740 may be networking switches, routers, hubs, etc. In addition, the traces 720 communicatively couple the networking units 740. Consequently, redundancy is provided. For example, if one networking unit were to fail, the other networking unit(s) should still be able to provide a network connection to the computer units 730. The external communication links 750 provide communication between the networking units and external networks.

Figure 8:
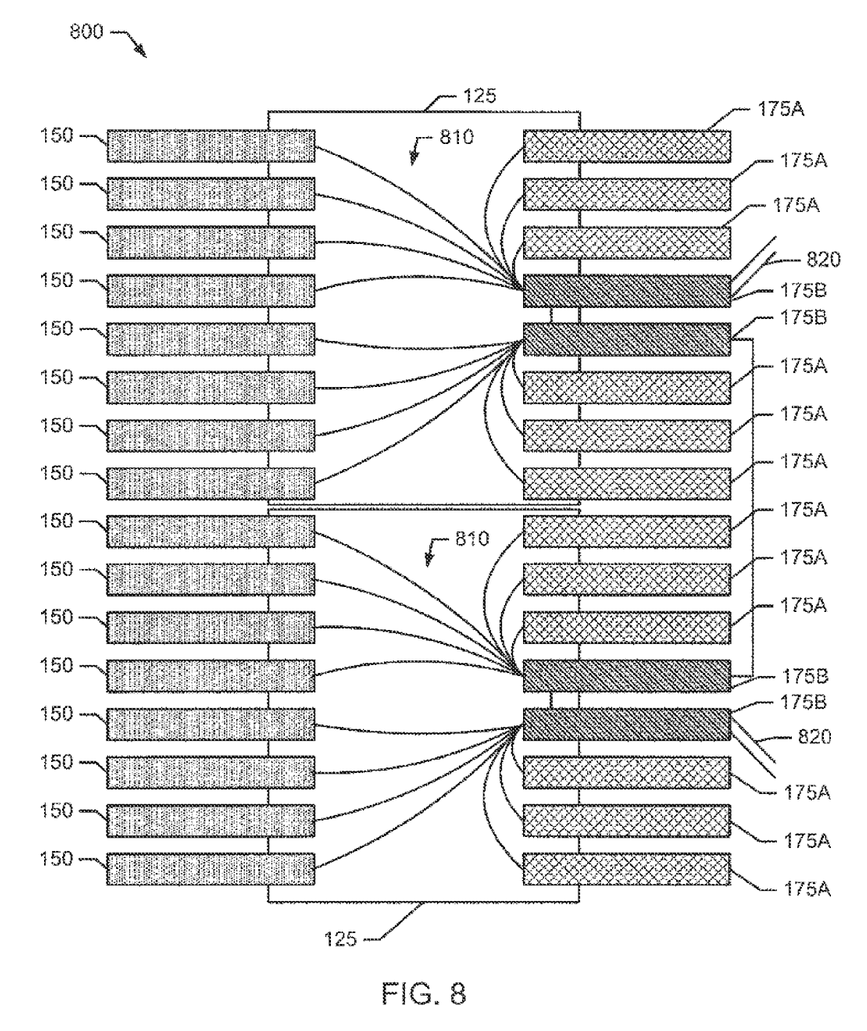
FIG. 8 is a diagram of an example backplane implementation implemented in the example computer rack of FIG. 1.

FIG. 8 is a diagram of an example backplane 800 implemented in the example electronics stack 100 of FIG. 1. The example backplane 800 of FIG. 8 represents a dumbbell topology. The example backplane 800 comprises the spine 125, the compute blades 150, the non-compute blades 175A and 175B, traces 810, and external communication links 820. As described earlier, the spine 125 carries the traces 810 from the compute blades 150 to the non-compute blades 175. Using the dumbbell-topology, the amount of traces on the spine can be greatly reduced, leading to a smaller size spine and thereby increasing environmental sustainability. In the illustrated example, there are sixteen compute blades and sixteen non-compute blades. However, any number(s) and/or distribution of compute and non-compute blades 150, 175 may additionally or alternatively be used. For example, the spine 125 may have a total of sixty four horizontal support structures, thereby allowing for more blades. Additionally or alternatively, the number of compute blades 150 does not need to match the number of non-compute blades 175.

In the illustrated example, two types of non-compute blades 175 are shown. For example, storage blades 175A are included to provide storage for the compute blades 150. The storage blades 175A may be structured similarly or identically to the example non-compute blade 175 shown in FIG. 4. Any or all of the storage blades 175A are coupled to one or more of the compute blades 150 via one or more memory and networking blades 175B. In the illustrated example, the memory and network blades 175B provide networking and memory sharing support for the compute blades 150. In such an example, components such as non-processor silicon components (e.g., memory modules of a non-compute blade 175) may be shared between two or more compute blades 150. In such an example, the memory and network blades 1758 comprise four memory modules and are communicatively coupled to four different compute blades 150. In some examples, the memory and network blades 175B are implemented to allow each compute blade 150 to access a respective one of the memory modules as additional memory. In some examples, the memory and network blade 175B is communicatively coupled to three storage blades 175A each comprising four hard disk drives (e.g., a total of 12 hard disk drives). In some examples, the memory and network blade 1758 may be implemented to allow each compute blade 150 to access three hard disk drives for storage. While in this example, the resources (e.g., memory modules and hard drives) are divided equally between the compute blades 150, the memory and network blade 175B may allocate non-equal amounts of resources to each compute blade 150. As a further example, resources may be allocated dynamically or upon the request of the compute blade 150.

The resources in the illustrated examples are shared across multiple blades. For example, a first memory module is allocated to a first compute blade 150. While a second compute blade may have been allocated a second memory module (e.g., a second memory module on the same memory and network blade 175B), the second compute blade 150 does not have access to the first memory module. This implementation preserves system boundaries as in the known design shown in FIG. 7. However, this implementation also results in bandwidth sharing amongst multiple compute blades (e.g., memory access bandwidth). For compute blades 150 with modest I/O requirements, the effects of bandwidth sharing may be small or negligible (e.g., system performance may not be affected more than 10%). While bandwidth sharing is shown, additional and/or alternative resource sharing methods may be implemented. For example, the second compute blade may have access to the first memory module from the previous example.

While in the illustrated examples, the shared resources comprise hard disk drives and memory modules, any types of resources may additionally or alternatively be shared such as, for example, graphics processing units, chipsets, management processors, I/O communication ports, etc.

While the blades 150, 175 shown in the illustrated example are segregated (e.g., compute blades 150 on one side of the spine 125, a non-compute blades 175 on the opposite side of the spine 125), blades 150, 175 can be attached to the spine in any configuration. Different example configurations of the blades are shown in connection with FIG. 10.

In the example of FIG. 8, the external communication links 820 function similarly to the external communication links 750 shown in FIG. 7. However, in addition to providing networking support, the external communication links 820 of FIG. 8 may alternatively and/or additionally communicatively couple the memory and networking blades 1758 of a first spine 125 to the memory and networking blades 1756 of a second spine 125. Such communicative coupling allows non-compute resources located on the second spine to be accessed by compute blades located on the first spine 125. Even further, such coupling allows a first computer rack to be comprised of all compute blades 150, while a second computer rack is comprised of all non-compute blades 175. Such configurations allow for blades 150, 175 which generate more heat to be grouped together so that cooling efforts can be concentrated on the hot areas, thereby improving cooling efficiency. In some such configurations, each computer rack 100 may have a memory and networking blade integrated into the spine 125. This configuration and other configurations are shown in connection with FIG. 10.

Figure 9:
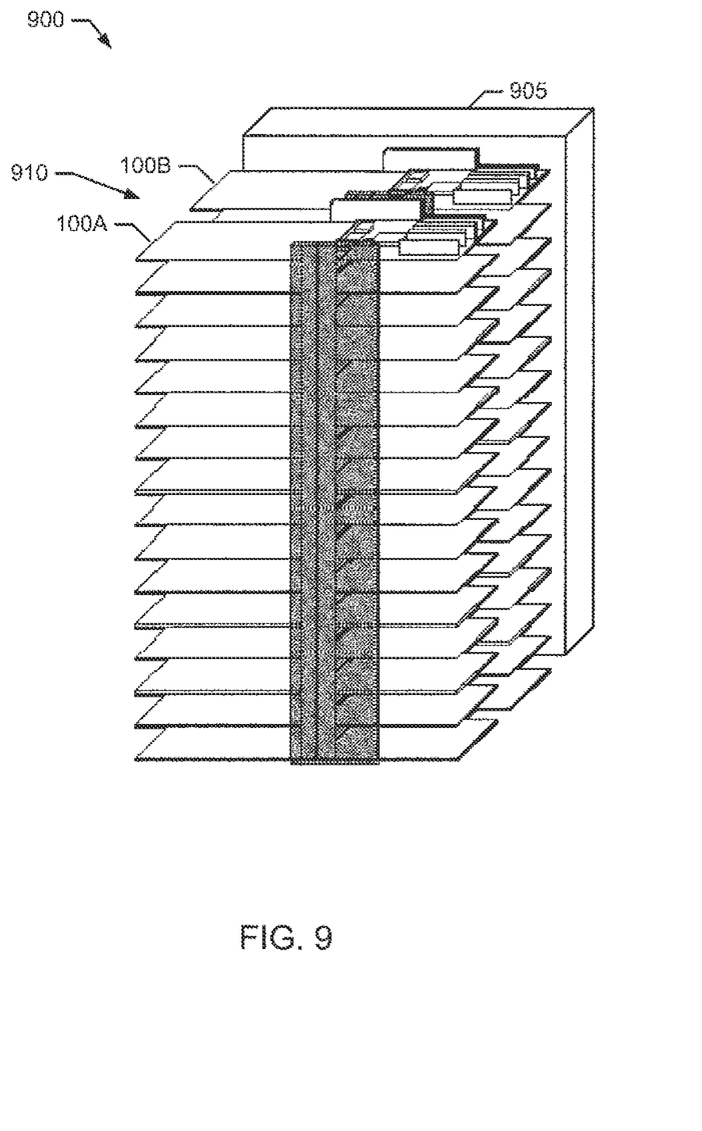
FIG. 9 is a diagram of an example data center comprising a plurality of the example computer rack shown in FIG. 1.

FIG. 9 is a diagram of an example data center 900 comprising multiple instances of the example computer rack 100 shown in FIG. 1. The example data center 900 comprises a power distribution unit 905, and a plurality 910 of computer racks 100A, 100B. In known data centers, power distribution units are placed within each computer rack. The example data center 900 of FIG. 9 combines and moves the power distribution units to the power distribution unit 905 at the end of the row of the plurality of computer racks 910. As a result, the power supplies for the data center are grouped into a shared, redundant pool. This physical arrangement has the benefits of reusing the same fan wall as the other computer racks, allows the computer racks 910 to be thermally uniform, and allows for simpler servicing (e.g., all power supply units are in a single location). For example, since all power supply units are contained in a single rack located at the end of the row of computer racks 910, the fan wall (e.g., fans that are directed towards the blades, which are further described in conjunction with FIG. 11) also cools the power distribution unit 905. In the illustrated example, the power distribution unit 905 is spaced from a first computer rack 100A, and is adjacent a second computer rack 100B such that the second computer rack 100E is located between the power distribution unit 905 and the first computer rack 100A.

Figure 10A:
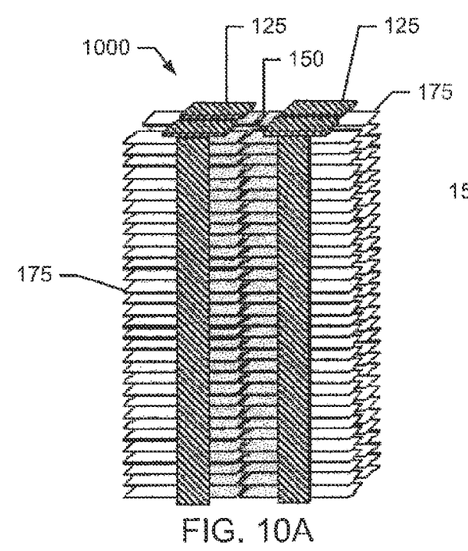
FIG. 10 is a diagram of example configurations using the example computer racks in the data center shown in FIG. 9.
Figure 10B:
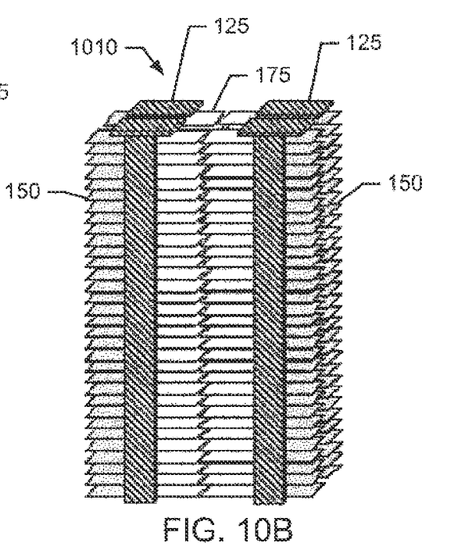
Figure 10C:
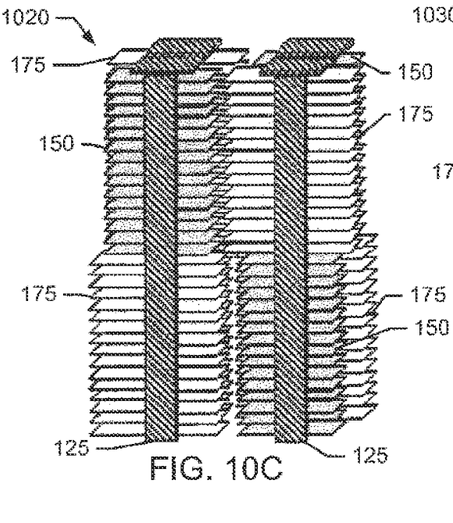
Figure 10D:
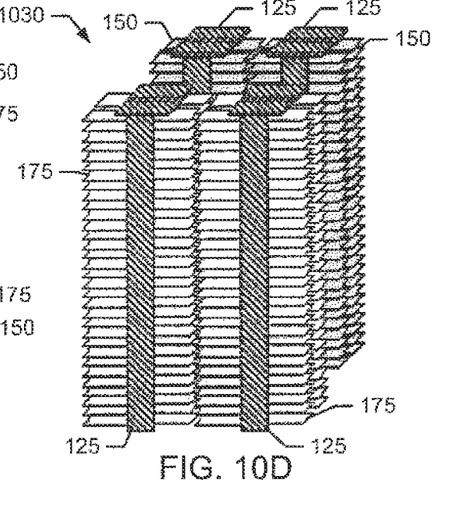

FIGS. 10A-10D illustrate example configurations of electronics stacks in a data center such as that shown in FIG. 9. FIGS. 10A-10D provide four example configurations illustrating how compute and non-compute blades may be aligned. The example configuration 1000 of FIG. 10A employs non-compute blades 175 on the exterior of the plurality of racks 910, and compute blades 150 in the interior of the plurality of racks 910. The example configuration 1010 of FIG. 10B reverses the interior/exterior relationship of the compute 150 and non-compute blades 175 of the first example configuration 1000. A third example configuration 1020 places compute blades 150 on the upper portion of the spines 125 of some computer racks and non-compute blades 175 on the lower portion of the spines 125 while on other computer racks, this configuration may be reversed as shown in FIG. 10C. A fourth example configuration 1030 shown in FIG. 10D employs only compute 150 or non-compute blades 175 in each of its racks. In the fourth configuration, a network blade 175B is also included with each spine to provide communication support. The various configurations of blade regions allow for cooling provisioning and prioritization that was not previously available in known data centers. The data centers of FIGS. 10A-10D create heterogeneous thermal zones. The heterogeneous thermal zones are created in the illustrated configurations due to compute blades 150 generating a volume of heat larger than the volume of heat generated by non-compute blades 175. Since the heating volumes are different, the blades 150, 175 can be organized such that cooling priority (e.g., proximity to fans) is given to blades that need more cooling (e.g., compute blades 150) over blades that need less cooling (e.g., non-compute blades 175).

Figure 11:
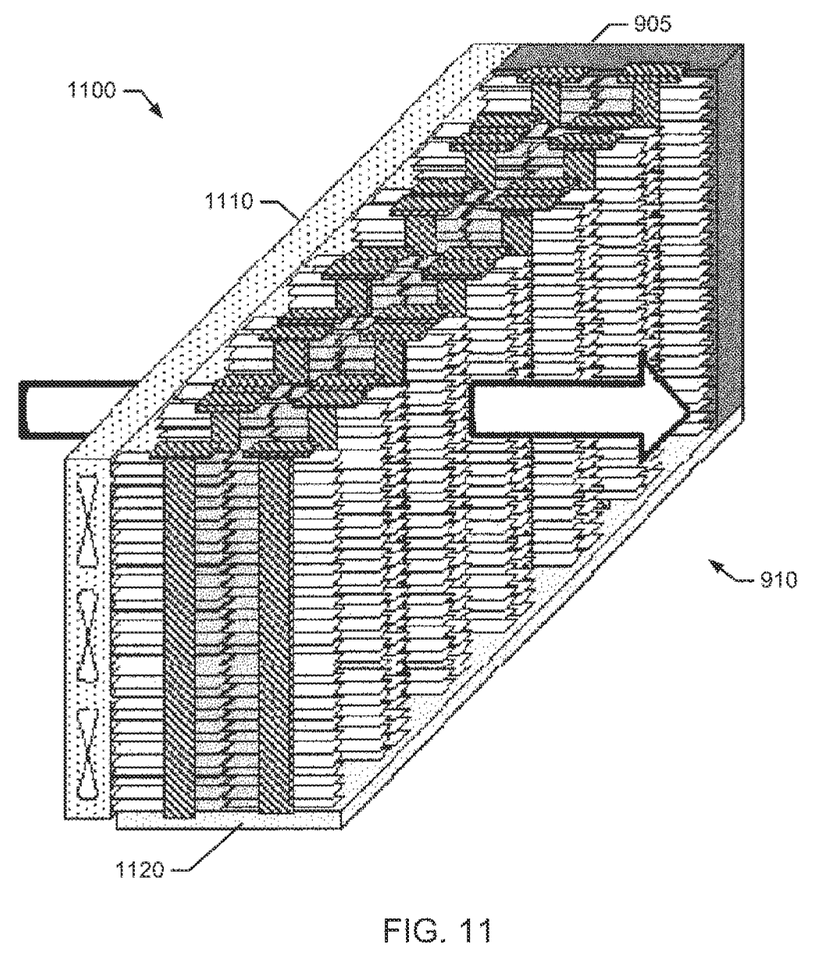
FIG. 11 is a diagram of an example data center layout including a single cooling unit per row of racks.

FIG. 11 illustrates an example data center 1100 including a single cooling unit 1110. The example data center 1100 comprises an end-of-rack power distribution unit 905, a plurality of computer racks 910, the cooling unit 1110, and a plenum 1120. In the illustrated example, the cooling unit 1110 is a direct expansion (DX) unit that chills a volume of air near the plurality of computer racks 910 (thereby cooling the computer racks). While the cooling unit 1110 is shown as a single unit chilling a single volume of air, the cooling unit may be implemented by two or more cooling units and/or be configured to chill more or less air at specific locations (e.g., near a set of blades 150, 175 which need more cooling). Further, the cooling unit 1110 may actively monitor the temperature near each blade and provide cooling on a blade-by-blade or blade-group by blade-group basis. Further, while the cooling unit shown in the illustrated example is a DX unit, any other type of cooling unit may additionally or alternatively be used. For example, a bank of fans may be used to move cool air past the blades.

In the illustrated example, the blades 150, 175 of the computer racks 910 are directly exposed to ambient air. For example, the blades 150, 175 are not immediately enclosed in a chassis. Known data centers, such as the data center described in FIG. 7 enclose each blade in a chassis. Exposing the blades 150, 175 directly to ambient air allows for more airflow and cooling capacity, thereby increasing the energy efficiency and thus the environmental sustainability of the data center.

In the illustrated example, the plenum 1120 is located below the computer racks 910, and allows for cabling to be routed between the computer racks (e.g., networking cables, power cables, etc.). Further, the plenum allows aft to circulate and thereby enhances the ability to effectively cool the computer racks.

Figure 12:
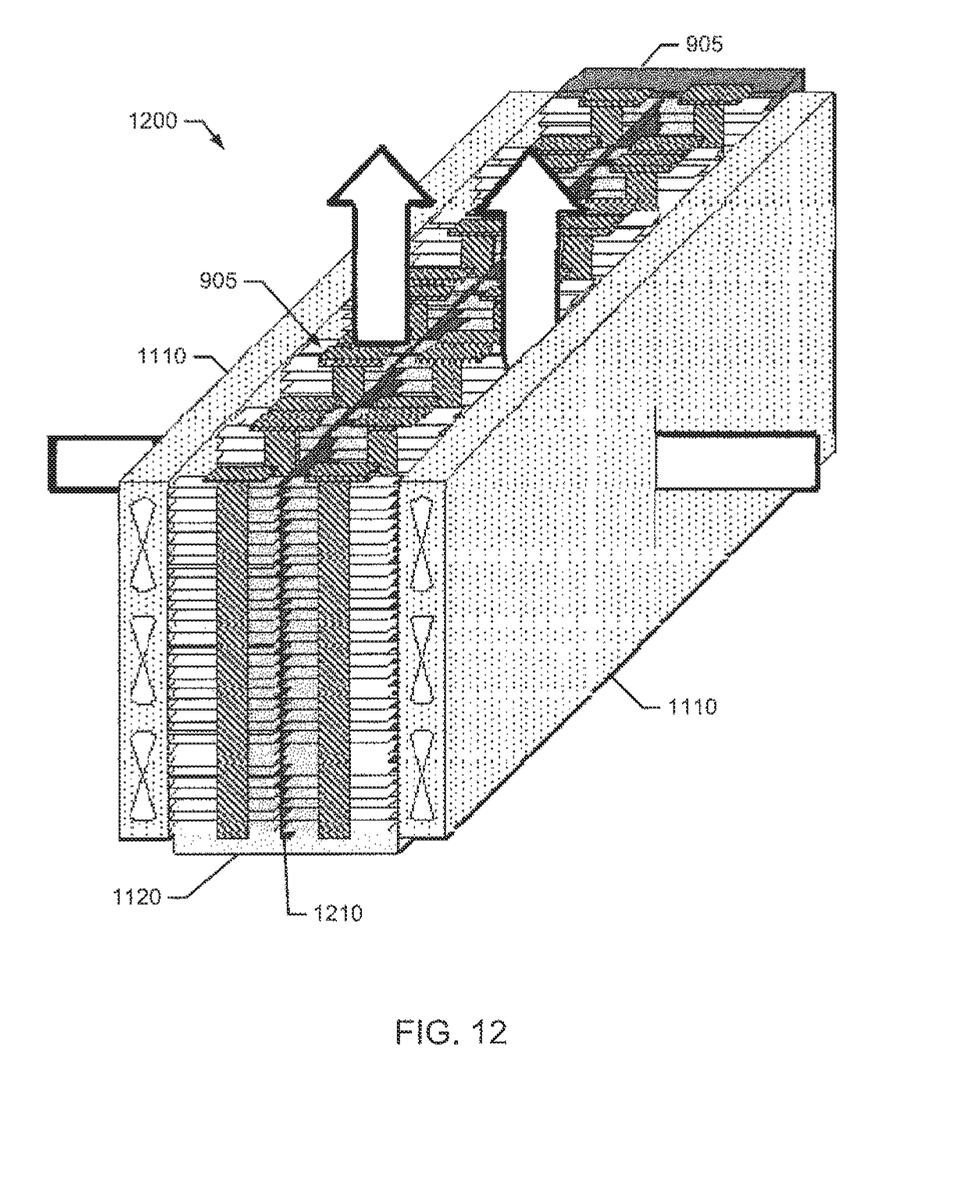
FIG. 12 is a diagram of an example data center layout including multiple cooling units per row of racks.

FIG. 12 is a diagram of an example data center 1200 including multiple cooling units 1110. The example data center 1200 comprises an end-of-rack power distribution unit 905, a plurality of computer racks 905, multiple cooling units 1110, a plenum 1120, and a cooling wall 1210. In the illustrated example, the cooling units 1110 chill the air which when moved past the blades is heated and moves upwards. To facilitate the cooling, a cooling wall 1210 is positioned to prohibit air flow from, and thus, adverse heat transfer from one computer rack to another. The cooling wall 1210 may contain a liquid to further cool the air passing over the surface of the cooling wall 1210. While in the illustrated example a cooling wall is used, any other cooling unit may additionally or alternatively be used. In some examples, the cooling wall omitted.

As a further example, the compute blades 150 and non-compute blades 175 may be located in separate geographic locations. For example, a first computer rack comprising, for example, mostly or even only, compute blades 150 may be located in a first geographic area while a second computer rack comprising, for example, mostly or even only, non-compute blades may be located in a second geographic area different from the first geographic area. For example, the first geographic location may have a colder climate (e.g., exhibit an ambient temperature which, on average, is cooler than the average ambient temperature of the second geographic location) and the second geographic area may have a warmer climate (e.g., exhibit an ambient temperature which, on average, is warmer than the average temperature of the first geographic location). The buildings in which the computer racks are located may be constructed differently in each geographic location in view of these climate conditions. For example, a first building in a first geographic location (e.g., Alaska) may be designed to exchange air internal to the building more readily with air external to the building, while a second building in a second geographic region may be designed to use electricity to cool the building (e.g., electricity may be more inexpensive in some regions or available through alternative energy sources such as wind, solar, water, etc.). As a result of these climate differences and building structure differences, the costs of cooling may be different in the first location than in the second location. As a result, the racks including components that require generally more cooling (e.g., a rack with mostly compute blades that produce more heat in use than a rack with mostly non-compute blades) may be placed in whichever of the first or second locations requires lower energy usage and/or costs for cooling while racks including components that require generally less cooling (e.g., a rack with mostly non-compute blades) may be placed in the other of the first or second locations. The racks in the first location can utilize the resources of the racks in the second location.

Disaggregated memory configurations, such as the memory configurations discussed in this disclosure which allow compute blades 150 to access memory of non-compute blades 175 may be implemented by Peripheral Component Interconnect Express (PCIe). Such an approach can be utilized in the above example with racks in different geographic locations to achieve improved cooling efficiencies such that compute blades in one of the locations utilize memory resources of non-compute blades in the other of the locations. Example interconnections between compute and non-compute blades are described in a paper by Kevin Lim, Jichuan Chang, Trevor Mudge, Parthasarathy Ranganathan, Steven K. Reinhardt, and Thomas F. Wenisch, entitled "Disaggregated Memory For Expansion And Sharing In Blade Servers," which was presented at the International Symposium on Computer Architecture (ISCA) 2009, and which is hereby incorporated by reference in its entirety.

Although certain systems, apparatus, and articles of manufacture have been described herein, the scope of coverage of this patent is not limited thereto. On the contrary, this patent covers all systems, apparatus, and articles of manufacture fairly falling within the scope of the appended claims either literally or under the doctrine of equivalents.

What is claimed is:

1. A computer rack comprising:
   a spine;
   a first set of support structures and a second set of support structures extending from the spine, each of the support structures being positioned to receive a respective blade;
   a first communication port carried by the spine and associated with the first set of support structures;
   a second communication port carried by the spine and associated with the second set of support structures; and
   a cooling unit to direct a greater volume of cooling air towards the set of support structures with a greater volume of heat generation.

2. The computer rack as described in claim 1, wherein a first of the first set of support structures, a first of the second set of support structures, and a first central member of the spine form a first H-shaped profile.

3. The computer rack as described in claim 2, further comprising a second of the first set of support structures, a second of the second set of support structures, and a second central member of the spine form a second H-shaped profile, the first and second H-shaped cross sections being separated by a distance, the distance selected to streamline an airflow.

4. The computer rack as described in claim 1, wherein the spine includes a first column and a second column, the first and second columns being generally oriented parallel to each other.

5. The computer rack as described in claim 1, wherein the spine communicatively couples the first and second communication ports.

6. The computer rack as described in claim 1, further comprising a non-compute blade including at least one of a hard disk drive, a memory unit, a networking module, or a controller.

7. The computer rack as described in claim 6, wherein the controller directs communication from a compute blade to a least one of the memory unit, the hard disk drive, or the networking module.

8. The computer rack as described in claim 1, wherein a first of the first set of support structures receives a compute blade and a first of the second set of support structures receives a non-compute blade.

9. The computer rack as described in claim 1, comprising a compute blade inserted into a first of the first set of support members, wherein the compute blade generates a first volume of heat and a non-compute blade inserted into a second of the second set of support members, wherein the non-compute blade generates a second volume of heat, wherein the first volume of heat is different from the second volume of heat.

10. The computer rack as described in claim 1, comprising at least one first blade inserted into a first of the first set of support members, wherein the first blade generates a first volume of heat, and at least one second blade inserted into a first of the second set of support members, wherein the second blade generates a second volume of heat, and wherein the first volume of heat is different from the second volume of heat.

11. A system comprising:
    a first computer rack having a first spine and a first plurality of support structures projecting from the first spine and positioned to support a first plurality of blades;
    a second computer rack having a second spine and a second plurality of support structures projecting from the second spine and positioned to support a second plurality of blades;
    a power distribution stack including multiple power supplies to provide power to the first and second computer racks; and
    a cooling unit to direct a greater volume of cooling air towards the computer rack with a greater volume of heat generation.

12. The system as described in claim 11, wherein the first computer rack and the second computer rack are in communication via first and second non-compute blades, the first non-compute blade received by a first support structure of the first computer rack and the second non-compute blade received by a second support structure of the second computer rack.

13. The system as described in claim 12, wherein the first computer rack receives first and second compute blades of the first plurality of blades and the second computer rack receives a non-compute blade of the second plurality of blades, wherein the first and second compute blades share non-processor components of the non-compute blade.

14. The system as described in claim 13, wherein the first compute blade may be at least one of refreshed, upgraded, or recycled independent of the non-compute blade.

15. A computer rack comprising:
    a spine including a first column, a second column and a central member, the first and second columns being generally oriented parallel to each other;
    a first support structure and a second support structure extending from the spine, each of the support structures being positioned to receive a respective blade, the first and second support structures and the central member form an H-shaped profile;
    a first communication port carried by the spine and associated with the first set of support structures;
    a second communication port carried by the spine and associated with the second set of support structures, wherein the spine communicatively couples the first and second communication ports; and
    a cooling unit to direct a greater volume of cooling air towards the set of support structures with a greater volume of heat generation.

* * * * *